United States Patent
Kim

(10) Patent No.: US 9,105,225 B2
(45) Date of Patent: Aug. 11, 2015

(54) DISPLAY DEVICE WITH MODULATED GATE-ON GATE-OFF VOLTAGES AND DRIVING METHOD THEREOF

(75) Inventor: Hun Tae Kim, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 223 days.

(21) Appl. No.: 13/603,863

(22) Filed: Sep. 5, 2012

(65) Prior Publication Data

US 2013/0314392 A1  Nov. 28, 2013

(30) Foreign Application Priority Data

May 23, 2012 (KR) .......... 10-2012-0054709

(51) Int. Cl.
G09G 3/36 (2006.01)
G09G 3/20 (2006.01)

(52) U.S. Cl.
CPC .......... G09G 3/20 (2013.01)

(58) Field of Classification Search
CPC .................................. G09G 2310/02
USPC .................................. 345/100
See application file for complete search history.

(56) References Cited

U.S. PATENT DOCUMENTS

| 6,067,064 A * | 5/2000 | Furuhashi et al. .............. 345/89 |
| 8,044,981 B2 | 10/2011 | Chen et al. |
| 8,552,956 B2 * | 10/2013 | Jang et al. .............. 345/100 |
| 2002/0015017 A1 * | 2/2002 | Kwag .............. 345/89 |
| 2004/0095342 A1 * | 5/2004 | Lee et al. .............. 345/211 |
| 2011/0157123 A1 * | 6/2011 | Cho .............. 345/211 |
| 2011/0157132 A1 * | 6/2011 | Byun et al. .............. 345/211 |
| 2011/0169804 A1 | 7/2011 | Sugimoto et al. |

FOREIGN PATENT DOCUMENTS

| JP | 2008236660 | 10/2008 |
| KR | 1020040016662 | 2/2004 |
| KR | 1020080038840 | 5/2008 |
| KR | 1020080052916 | 6/2008 |
| KR | 1020080060681 | 7/2008 |
| KR | 100914196 | 8/2009 |
| KR | 1020100074858 | 7/2010 |
| KR | 1020110048685 | 5/2011 |
| KR | 1020110070178 | 6/2011 |

\* cited by examiner

*Primary Examiner* — Chanh Nguyen
*Assistant Examiner* — Roy Rabindranath
(74) *Attorney, Agent, or Firm* — Cantor Colburn LLP

(57) ABSTRACT

A display panel includes a plurality of gate lines and a plurality of pixels disposed thereon, a gate driver which applies a gate signal to the gate lines, and a controller which controls the gate driver, where the controller includes a signal controller which generates a scanning start signal and a gate clock signal comprising a plurality of pulses, where the scanning start signal instructs to start a scanning of the gate signal, and a driving voltage modulator which generates a modulated gate-on voltage and a modulated gate-off voltage based on a basic gate-on voltage and a basic gate-off voltage, where the driving voltage modulator adds an overshoot voltage corresponding to a rising edge of a pulse of the gate clock signal to the basic gate-on voltage or adds an undershoot voltage corresponding to a falling edge of the pulse of the gate clock signal to the basic gate-off voltage.

26 Claims, 12 Drawing Sheets

DISPLAY DEVICE WITH MODULATED GATE-ON GATE-OFF VOLTAGES AND DRIVING METHOD THEREOF

This application claims priority to Korean Patent Application No. 10-2012-0054709 filed on May 23, 2012, and all the benefits accruing therefrom under 35 U.S.C. §119, the content of which in its entirety is herein incorporated by reference.

BACKGROUND (a) Field

Exemplary embodiments of the invention relate to a display device including a driving device and a driving method of the display device including the driving device.

(b) Description of the Related Art

Generally, a display device includes a plurality of pixels, which is a unit for displaying an image, and a plurality of drivers.

In the display device, a plurality of pixels is connected to a plurality of gate lines and a plurality of data lines. Each of the pixels may include a switching element, such as a thin film transistor, which is connected to a gate line and a data line, and a pixel electrode connected to the gate line and the data line. The gate line and the data line may extend in different directions and cross each other.

The driver includes a data driver for applying a data voltage to the pixel and a gate driver for applying a gate signal that controls the switching element to apply the data voltage to a pixel.

The gate driver and the data driver may be integrated on the display panel, or may be mounted on a printed circuit board ("PCB") connected to the display panel in a chip form or disposed on the display panel.

The gate driver typically includes a shift register or a scanning driving circuit including a plurality of stages subordinately connected thereto. The gate driver may receive a plurality of driving voltages and a plurality of gate control signals to generate a gate signal. The driving voltage may include a gate-on voltage that turns on a switching element and a gate-off voltage that turns off the switching element, and the gate control signal may include a scanning start signal that instructs scanning starting, a gate clock signal that controls an output time of the gate-on pulse and the like. The gate driver generates a gate signal to be inputted to a corresponding gate line based on the driving voltage and the gate control signal to output the gate signal to the corresponding gate line.

A length of driving signal line such as a gate line and a data line typically increases as a size of a display panel of a display device increases. Accordingly, a delay may occur in the gate signal at a portion of a gate line that is far apart from the gate driver, e.g., an end portion of the gate line, thereby distorting a waveform of the gate-on pulse. Further, a length of a signal wire that transmits a driving voltage and a gate control signal inputted to the gate driver increases as the size of the display device increases, such that the waveform of the driving voltage and the gate control signal may be distorted as being away from an input point of the signals. Then, a deviation may occur in the gate-on pulse of the gate signal according to the position of the display panel of the display device. Further, a length of the data line may increase as the size of the display panel increases, such that the data signal may be delayed according to the position of the display panel. Accordingly, the input timing of the data voltage inputted to the switching element and the input timing of the gate signal may not be synchronized with each other, and luminance of the image may be degraded.

SUMMARY

Exemplary embodiments of the invention relate to a display device including a driving device, where a gate signal is effectively prevented from being distorted according to a position thereof in a display panel and a signal delay of a data voltage is effectively compensated, and relate to a driving method of the display device including the driving device.

An exemplary embodiment of the invention provides a display panel including a plurality of gate lines and a plurality of pixels disposed thereon, a gate driver which applies a gate signal to the gate lines, and a controller which controls the gate driver, where the controller includes a signal controller which generates a scanning start signal and a gate clock signal comprising a plurality of pulses, where the scanning start signal instructs to start a scanning of the gate signal, and a driving voltage modulator which generates a modulated gate-on voltage and a modulated gate-off voltage based on a basic gate-on voltage and a basic gate-off voltage, where the driving voltage modulator adds an overshoot voltage corresponding to a rising edge of a pulse of the gate clock signal to the basic gate-on voltage or adds an undershoot voltage corresponding to a falling edge of the pulse of the gate clock signal to the basic gate-off voltage.

In an exemplary embodiment, the gate signal may include a gate-on pulse, and the gate-on pulse may include the modulated gate-on voltage corresponding to a high level section of the pulse of the gate clock signal and the modulated gate-off voltage corresponding to a low level section of the gate clock signal.

In an exemplary embodiment, the basic gate voltage may increase on a frame-period-by-frame-period basis such that the basic gate-on voltage corresponding to the gate lines is changed for every at least one gate line.

In an exemplary embodiment, the basic gate-off voltage may be substantially constant.

In an exemplary embodiment, the signal controller may generate a shoot digital signal including information on at least one of the overshoot voltage changed over a one-frame period and the undershoot voltage changed over a one-frame period and transmits the information to the driving voltage modulator, the driving voltage modulator may include a digital-analog converter which converts the shoot digital signal into a shoot analog voltage, and the driving voltage modulator may generate the modulated gate-on voltage and the modulated gate-off voltage based on the shoot analog voltage.

In an exemplary embodiment, at least one of the overshoot voltage and the undershoot voltage may be changed for every at least one pulse of the gate clock signal.

In an exemplary embodiment, the gate driver may receive the modulated gate-on voltage, the modulated gate-off voltage and the gate clock signal and generate the gate signals to be sequentially inputted to the plurality of gate lines.

In an exemplary embodiment, the controller may further include a clock signal generator which receives the modulated gate-on voltage and a common low voltage, generates a clock signal based on the scanning start signal and the gate clock signal and transmits the clock signal to the gate driver.

In an exemplary embodiment, the gate clock signal may include a first gate clock signal and a second gate clock signal, which are reversed from each other, the modulated gate-on voltage may include a modulated first gate-on voltage corresponding to the first gate clock signal and a modulated second gate-on voltage corresponding to the second gate clock signal, the modulated gate-off voltage may include a modulated first gate-off voltage corresponding to the first gate clock signal and a modulated second gate-off voltage corresponding to the second gate clock signal, and the clock signal may include a first clock signal generated based on the modulated first gate-on voltage and the first gate clock signal and a second clock signal generated based on the modulated second gate-on voltage and the second gate clock signal.

In an exemplary embodiment, the gate driver may include a plurality of stages, where the gate driver may generate the gate signal based on the scanning start signal, the first and second clock signals and the modulated first and second gate-off voltages, and output the gate signal to the gate lines.

Another exemplary embodiment of the invention provides a driving method of a display device, the method including: generating at least one gate clock signal including a scanning start signal, which instructs to start a scanning starting a gate clock signal including a plurality of pulses in a signal controller of a controller of the display device, generating a basic gate-on voltage and a basic gate-off voltage based on the scanning start signal in a voltage generator of the controller, and generating a modulated gate-on voltage and a modulated gate-off voltage based on the basic gate-on voltage and the basic gate-off voltage in a driving voltage modulator of the controller by adding an overshoot voltage corresponding to a rising edge of a pulse of the gate clock signal to the basic gate-on voltage or adding an undershoot voltage corresponding to a falling edge of the pulse of the gate clock signal to the basic gate-off voltage, where the display device includes a display panel comprising a plurality of gate lines and a plurality of pixels disposed thereon, a gate driver which applies a gate signal to the gate lines, and the controller which controls the gate driver.

According to one or more exemplary embodiments of the invention, a gate-on pulse is substantially uniformalized by effectively preventing a gate signal from being distorted according to a position thereof in a display panel, and distortion due to a signal delay of a data voltage is compensated by controlling a gate-on pulse waveform.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
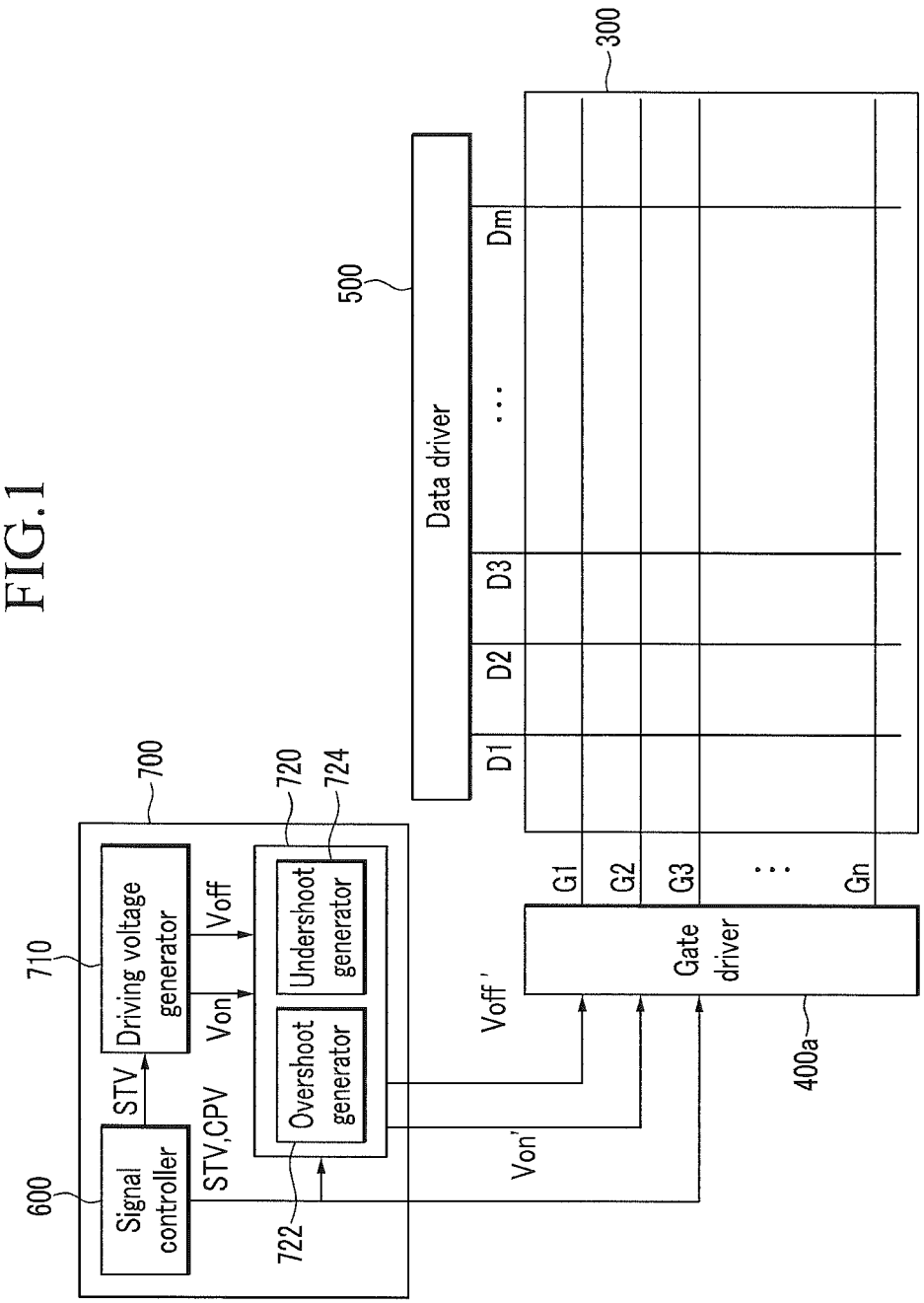
FIG. 1 is a block diagram showing an exemplary embodiment of a display device according to the invention.

The invention will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

First, referring to FIG. 1, FIG. 2, FIG. 3 and FIG. 4, an exemplary embodiment of a driving device according to the invention and a display device including the driving device will be described.

Figure 2:
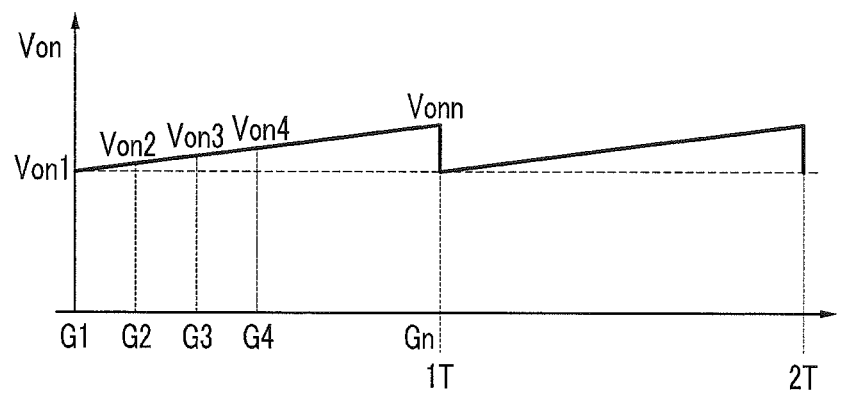
FIG. 2 is a waveform diagram of a basic gate-on signal generated by an exemplary embodiment of a driving voltage generator of the display device according to the invention.
Figure 3:
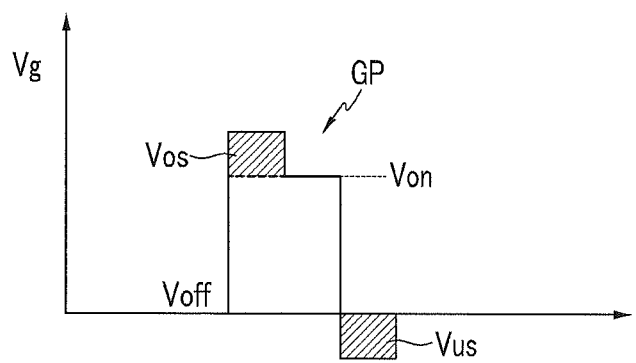
FIG. 3 is a waveform diagram of a gate-on-pulse modulated by an exemplary embodiment of a driving voltage modulator of the display device according to the invention.
Figure 4:
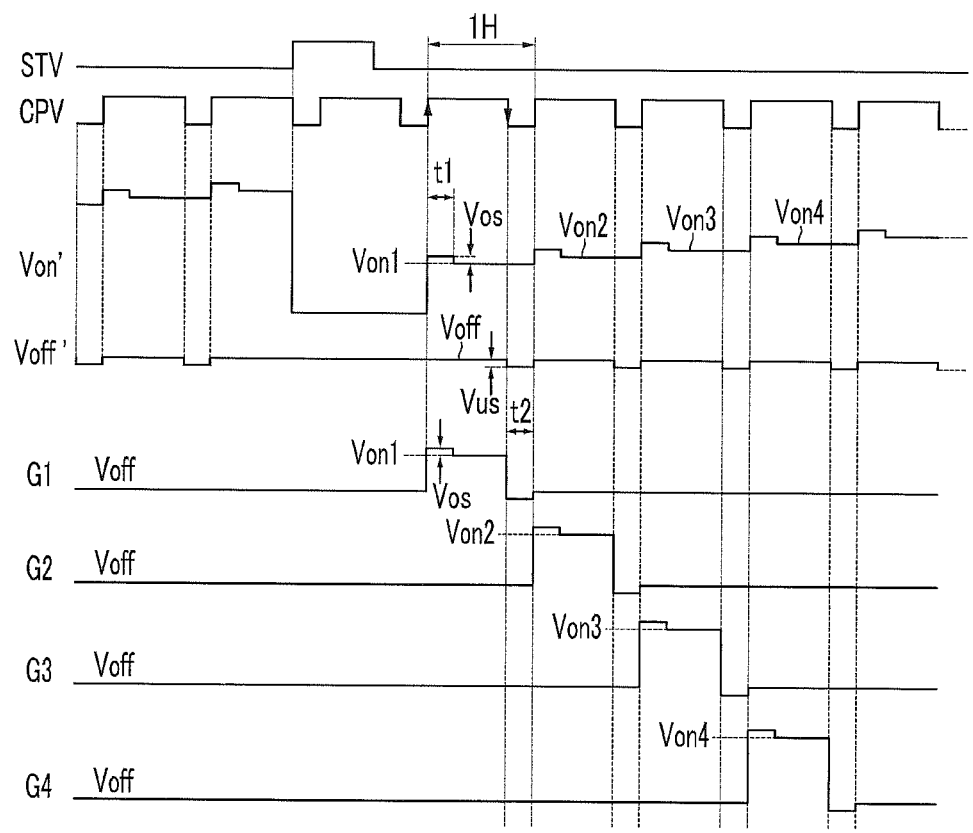
FIG. 4 is a signal timing diagram of a driving signal and a gate signal of an exemplary embodiment of the display device according to the invention.

FIG. 1 is a block diagram showing an exemplary embodiment of a display device according to the invention, FIG. 2 is a waveform diagram of a basic gate-on signal generated by an exemplary embodiment of a driving voltage generator of the display device according to the invention, FIG. 3 is a waveform diagram of a gate-on-pulse modulated by an exemplary embodiment of a driving voltage modulator of the display device according to the invention, and FIG. 4 is a signal timing diagram of a driving signal and a gate signal of an exemplary embodiment of the display device according to the invention.

Referring to FIG. 1, an exemplary embodiment of the display device according to the invention includes a display panel 300 and a driving device that drives the display panel 300. The driving device includes a gate driver 400a, a data driver 500 and a controller 700 connected to the gate and data drivers 400a and 500.

The display panel 300 includes a plurality of signal lines and a plurality of pixels (not shown) that is connected to the signal lines and may be disposed substantially in a matrix form.

The signal lines include a plurality of gate lines, e.g., a first gate line G1 to an n-th gate line Gn, that transmits a gate signal (referred to as "scanning signal") and a plurality of data lines, e.g., a first data line D1 to an m-th data line Dm, that transmits a data voltage.

Each of the pixels may include a switching element, such as a thin film transistor, which is connected to the gate lines G1 to Gn and the data lines D1 to Dm, and a pixel electrode (not shown) connected to the switching element. In an exemplary embodiment, the switching element is a three terminal element. In such an embodiment, a control terminal of the switching element is connected to the gate lines G1 to Gn, an input terminal of the switching element may be connected to the data lines D1 to Dm, and an output terminal of the switching element may be connected to the pixel electrode.

The controller 700 may include a signal controller 600, a driving voltage generator 710 and a driving voltage modulator 720.

The signal controller 600 controls the gate driver 400a, the data driver 500, the driving voltage generator 710 and the driving voltage modulator 720.

In an exemplary embodiment, the signal controller 600 outputs a scanning start signal STV that instructs a start of scanning and a gate control signal, such as a gate clock signal CPV, that controls an output time of a gate-on pulse to the gate driver 400a and the driving voltage modulator 720, and outputs the scanning start signal STV to the driving voltage generator 710. Referring to FIG. 4, the scanning start signal STV includes a pulse generated every unit frame, and the gate clock signal CPV may include a pulse corresponding to the number of gate lines G1 to Gn or resolution of an image in a unit frame. The period of the pulse of the gate clock signal CPV may be about one horizontal period 1H.

The signal controller 600 may output a data control signal including a horizontal synchronization start signal that indicates starting of image data transmission, a load signal that instructs application of the data voltage to the data lines D1 to Dm and application of a data clock signal HCLK to the data driver 500.

The driving voltage generator 710 receives the scanning start signal STV from the signal controller 600, generates a basic gate-on voltage Von that turns on the switching element and a basic gate-off voltage Voff that turns off the switching element, and outputs the basic gate-on and gate-off voltages Von and Voff to the driving voltage modulator 720.

Referring to FIG. 2, the basic gate-on voltage Von generated by the driving voltage generator 710 may not be substantially constant, and may be increased according to the time over a unit frame period 1T. In such an embodiment, where the basic gate-on voltage Von is applied as the gate-on pulse to the gate lines G1 to Gn through several elements, an increase in time in FIG. 2 may correspond to the order of the gate lines G1 to Gn that sequentially output the gate-on pulses.

In an exemplary embodiment, the basic gate-on voltage Von at a start point of a unit frame period 1T is a first basic gate-on voltage Von1 which corresponds to the first gate line G1. The voltage level of the basic gate-on voltage Von may increase over time in the unit frame 1T, such that a second basic gate-on voltage Von2 corresponds to the second gate line G2, a third basic gate-on voltage Von3 corresponds to the third gate line G3, a fourth basic gate-on voltage Von4 corresponds to the fourth gate line G4, and a last basic gate-on voltage Vonn corresponds to the last gate line Gn. Then, the voltage level of the basic gate-on voltage Von decreases to the first basic gate-on voltage Von1 at the start point of a next unit frame period T2.

The scanning start signal STV may be a reference for resetting the basic gate-on voltage Von into the first basic gate-on voltage Von1. In one exemplary embodiment, for example, the basic gate-on voltage Von may be set as the first basic gate-on voltage Von1 after a predetermined time from the falling edge of the pulse of the scanning start signal STV.

In an exemplary embodiment, the basic gate-on voltage Von during a unit frame, as shown in FIG. 2, may be increased at a predetermined ratio. In an alternative exemplary embodiment, the basic gate-on voltage Von during the unit frame may be increased geometrically or increased according to various manners, such as a quadratic function, for example.

In an alternative exemplary embodiment, the basic gate-on voltage Von may be changed for at least every two gate lines G1 to Gn. In one exemplary embodiment, for example, the first basic gate-on voltage Von1 may correspond to the first and second gate lines G1 and G2, and the second basic gate-on voltage Von2 may correspond to the third and fourth gate lines G3 and G4.

The basic gate-off voltage Voff generated by the driving voltage generator 710 may have a substantially constant voltage level lower than the voltage level of the basic gate-on voltage Von.

The driving voltage modulator 720 receives the gate control signal such as the scanning start signal STV and the gate clock signal CPV from the signal controller 600, and receives the basic gate-on voltage Von and the basic gate-off voltage Voff from the driving voltage generator 710 to generate a modulated gate-on voltage Von' and a modulated gate-off voltage Voff' based on the control signal, the basic gate-on voltage Von and the basic gate-off voltage Voff.

In an exemplary embodiment, the driving voltage modulator 720 may include an overshoot generator 722 and a undershoot generator 724. The overshoot generator 722 may add an overshoot voltage Vos based on basic gate-on voltages, e.g., the first to n-th basic gate-on voltages Von1 to Vonn, corresponding to the gate lines G1 to Gn to generate the modulated gate-on voltage Von', and the undershoot generator 724 may add a undershoot voltage Vus based on a basic gate-off voltage Voff to generate the modulated gate-off voltage Voff'.

Referring now to FIG. 4, the overshoot generator 722 selects the basic gate-on voltage Von corresponding to the rising edge of each pulse of the gate clock signal CPV generated after the pulse of the scanning start signal STV to maintain the basic gate-on voltage during about one horizontal period 1H. The basic gate-on voltage Von corresponding to the rising edge of the pulse of the gate clock signal CPV may be the first to n-th basic gate-on voltages Von1 to Vonn shown in FIG. 2.

In an exemplary embodiment, the overshoot voltage Vos having a positive (+) value is added to the basic gate-on voltages Von1 to Vonn at the rising edge of each pulse of the gate clock signal CPV for a predetermined time to generate the modulated gate-on voltage Von' such that the voltage level of the basic gate-on voltages Von1 to Vonn is raised by the overshoot voltage Vos during the predetermined time. The time duration t1 of the overshoot voltage Vos may be controlled to be shorter than about one horizontal period 1H. In one exemplary embodiment, for example, the time duration t1 of the overshoot voltage Vos may be shorter than about a half one horizontal period ½H.

The undershoot generator 724 adds the undershoot voltage Vus having a negative (−) value to the basic gate-off voltage Voff at the falling edge of each pulse of the gate clock signal CPV generated after the pulse of the scanning start signal STV for a predetermined time to generate the modulated gate-off voltage Voff'. The time duration t2 of the undershoot voltage Vus is shorter than about one horizontal period 1H and may be substantially the same as an interval between the pulses, e.g., two consecutive pulses, of the gate clock signal CPV, that is, a low level period. In such an embodiment, the time duration t2 of the undershoot voltage Vus may be variously controlled. In one exemplary embodiment, for example, the time duration t2 of the undershoot voltage Vus may be controlled to be shorter than about a half one horizontal period 1H.

In an exemplary embodiment, the gate driver 400a is connected to the gate lines G1 to Gn of the display panel 300. The gate driver 400a receives the gate control signal, such as the scanning start signal STV and the gate clock signal CPV, from the signal controller 600 and receives the modulated gate-on voltage Von' and the modulated gate-off voltage Voff' from the driving voltage modulator 720 to generate the gate signal Vg including at least one gate-on pulse GP, thus applying the gate signal to the gate lines G1 to Gn. In such an embodiment, the gate control signal, the modulated gate-on voltage Von' and the modulated gate-off voltage Voff' inputted from the controller 700 may be inputted to the gate driver 400a through a separate signal wire.

Referring to FIG. 4, the gate driver 400a generates the gate-on pulse GP using the modulated gate-on voltage Von' and the modulated gate-off voltage Voff' corresponding to the gate clock signal CPV of about one horizontal period 1H, and sequentially applies the gate-on pulses GP generated corresponding to the continuous pulse of the gate clock signal CPV to the gate lines G1 to Gn. In such an embodiment, the gate driver 400a selects the modulated gate-on voltage Von' corresponding to a high level period of each pulse of the gate clock signal CPV and selects the modulated gate-off voltage Voff' corresponding to a low level period of the gate clock signal CPV to generate the gate-on pulse GP to be applied to each of the gate lines G1 to Gn.

Referring to FIG. 3 and FIG. 4, the gate-on pulse GP of each gate signal Vg includes a portion having a voltage level raised by the overshoot voltage corresponding to the rising edge of the pulse of the gate clock signal CPV and a portion having a voltage level lowered by the undershoot voltage Vus corresponding to the falling edge of the pulse of the gate clock signal CPV based on the basic gate-on voltages Von1 to Vonn corresponding to the pulses of the gate clock signal CPV. The width of each gate-on pulse GP may be substantially the same as one horizontal period 1H.

The gate driver 400a may apply the basic gate-off voltage Voff to the gate lines G1 to Gn when the gate-on pulse GP is not applied.

The data driver 500 is connected to the data lines D1 to Dm of the display panel 300, and applies the data voltage corresponding to the input image signal to the data lines D1 to Dm.

In an exemplary embodiment, the gate driver 400a or the data driver 500 may be disposed in at least one chip form on the display panel 300. In an alternative exemplary embodiment, the gate driver 400a or the data driver 500 may be mounted on a flexible printed circuit film (not shown) to be attached to the display panel 300 in a tape carrier package ("TCP") form. In another alternative exemplary embodiment, the gate driver 400a or the data driver 500 may be mounted on a separate printed circuit board ("PCB") (not shown). In another alternative exemplary embodiment, the gate driver 400a or the data driver 500 may be integrated on the display panel 300 together with the switching element, e.g., the thin film transistor.

In an exemplary embodiment, the overshoot voltage Vos is added to a start portion of the gate-on pulse GP of the gate signal Vg, the undershoot voltage Vus is added to a last portion of the gate signal Vg, and the gate signal Vg is then applied to the gate lines G1 to Gn such that distortion of the gate signal waveform according to the signal delay of various driving voltages and driving signals inputted from the controller 700 to the gate driver 400a may be substantially reduced or effectively prevented. In such an embodiment, a luminance deviation by the waveform deviation of the gate-on pulse according to the position of the display panel 300 may be reduced. Further, the timing of the data voltage inputted to the switching element of the pixel and the timing of the gate-on pulse may be precisely adjusted, thus, an image to be exhibited may be precisely displayed. Particularly, the aforementioned process is useful to enlargement of the display panel 300.

In a display panel 300 of a large size, the data lines D1 to Dm are substantially long such that a data voltage may be applied to the switching element of the pixel with delay or distortion at a point far apart from the data driver 500 due to the signal delay. In an exemplary embodiment, the application timing of the gate-on pulse and the application timing of the data voltage may be adjusted by controlling, for example, the basic gate-on voltage Von, the overshoot voltage Vos and the undershoot voltage Vus of the gate-on pulse GP and the time durations of the overshoot voltage Vos and the undershoot voltage Vus.

Next, referring again to FIG. 1 to FIG. 4, an exemplary embodiment of a driving method of the display device according to the invention will be described.

The signal controller 600 receives an input image signal and an input control signal, which controls display of the input image signal, from the external graphic controller (not shown). The input image signal has information on luminance of each pixel, and the luminance corresponds to a gray level of a predetermined value. In an exemplary embodiment, the input control signal include a vertical synchronization signal, a horizontal synchronization signal, a main clock signal and a data enable signal, for example.

The signal controller 600 processes the input image signal based on the input image signal and the input control signal, converts the input image signal into the output image signal. The signal controller 600 generates the gate control signal including the scanning start signal STV and the gate clock signal CPV, and outputs the gate control signal to the gate driver 400a and the driving voltage modulator 720. The signal controller 600 generates the data control signal and outputs the data control signal to the data driver 500.

The driving voltage generator 710 receives the scanning start signal STV from the signal controller 600, generates the basic gate-off voltage Voff and outputs the basic gate-off voltage to the driving voltage modulator 720.

The driving voltage modulator 720 receives the gate control signal, such as the scanning start signal STV and the gate clock signal CPV, from the signal controller 600, receives the basic gate-on voltage Von and the basic gate-off voltage Voff from the driving voltage generator 710 and generates a modulated gate-on voltage Von' and a modulated gate-off voltage Voff' based on the gate control signal and the basic gate-on and gate-off voltages Von and Voff.

The data driver 500 generates a data voltage corresponding to the output image signal and applies the data voltage to a corresponding data line of the data lines D1 to Dm.

The gate driver 400a generates the gate signal including the gate-on pulse GP based on the gate control signal from the signal controller 600 and the modulated gate-on voltage Von' and the modulated gate-off voltage Voff' from the driving voltage modulator 720, and applies the gate signal to the gate lines G1 to Gn.

Then, the data voltage applied to the data lines D1 to Dm is applied to a corresponding pixel through the turned-on switching element such that the pixel display the luminance corresponding to the gray level of the input image signal.

Hereinafter, referring to FIG. 5, FIG. 6, FIG. 7 and FIG. 8, an alternative exemplary embodiment of a driving device according to the invention and a display device including the driving device will be described. The same or like elements shown in FIGS. 5 to 8 have been labeled with the same reference characters as used above to describe the exemplary embodiments of the display device shown in FIGS. 1 to 4, and any repetitive detailed description thereof will hereinafter be omitted or simplified.

Figure 5:
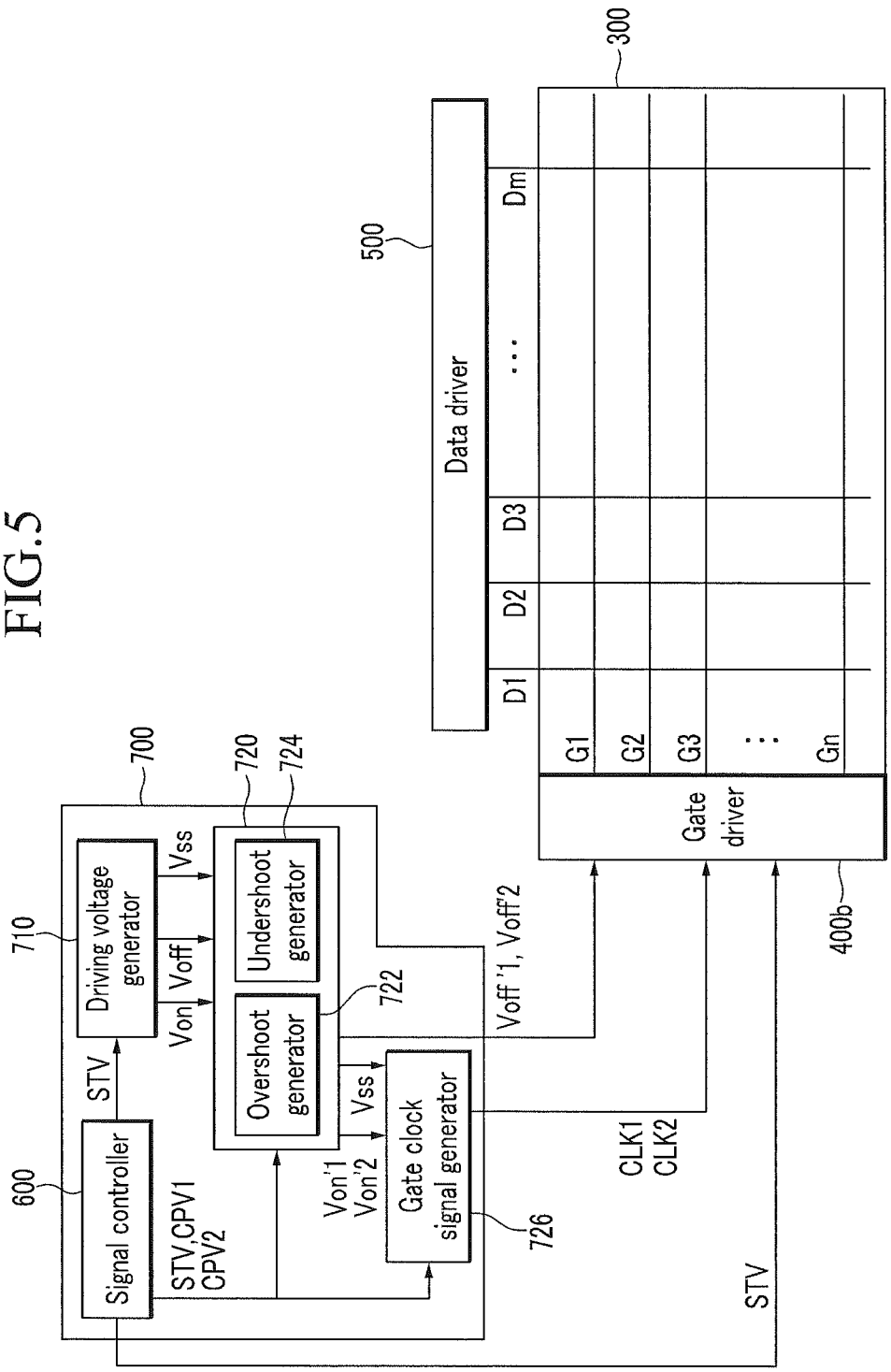
FIG. 5 is a block diagram showing an alternative exemplary embodiment of the display device according to the invention.
Figure 6:
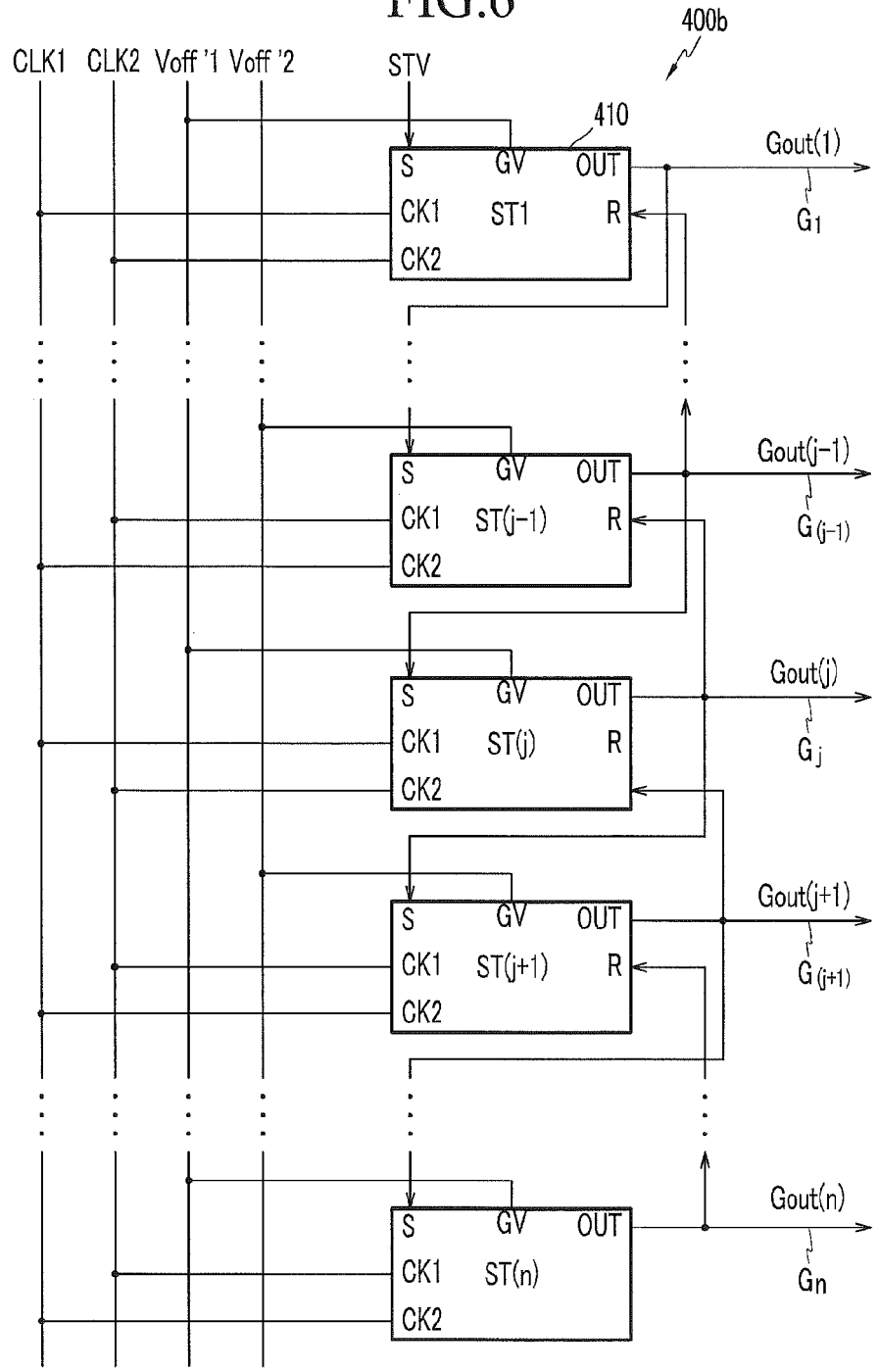
FIG. 6 is a block diagram showing an exemplary embodiment of a gate driver of the display device according to the invention.
Figure 7:
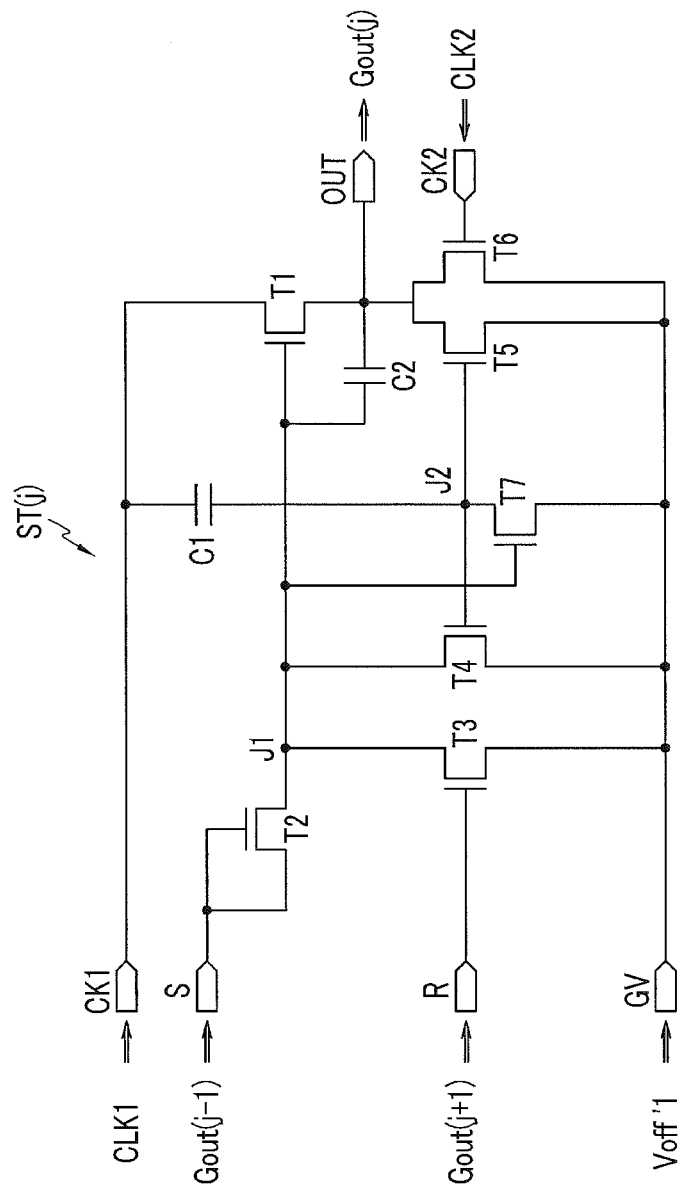
FIG. 7 is a circuit diagram showing an exemplary embodiment of a j-th stage of a shift register in the gate driver shown in FIG. 6.
Figure 8:
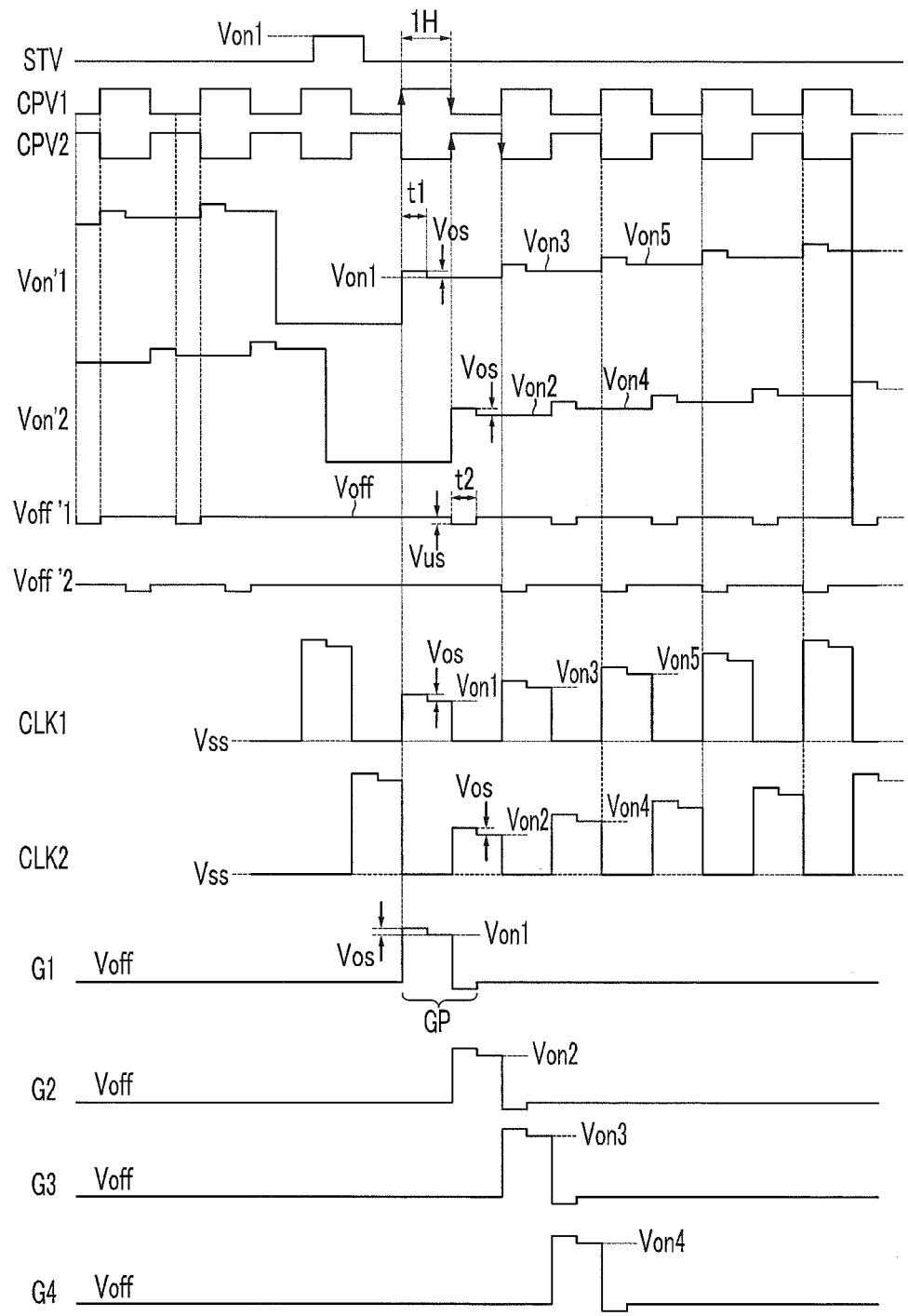
FIG. 8 is a signal timing diagram of the driving signal and the gate signal of an exemplary embodiment of the display device according to the invention.

FIG. 5 is a block diagram showing an alternative exemplary embodiment of the display device according to the invention, FIG. 6 is a block diagram of an exemplary embodiment of a gate driver of the display device according to the invention, FIG. 7 is a circuit diagram of an exemplary embodiment of a j-th stage of a shift register in the gate driver shown in FIG. 6, and FIG. 8 is a signal timing diagram of the driving signal and the gate signal of an exemplary embodiment of the display device according to the invention.

The display device in FIG. 5 is substantially the same as the display device shown in FIG. 1 except for the controller 700.

An exemplary embodiment of the display device includes the display panel 300, the gate driver 400b and the data driver 500 as a driving device for driving the display panel 300, and the controller 700 connected to the gate and data drivers 400b and 500.

In an exemplary embodiment, as shown in FIG. 5, the controller 700 includes the signal controller 600, the driving voltage generator 710, the driving voltage modulator 720 and a clock signal generator 726.

The signal controller 600 outputs the scanning start signal STV, a first gate clock signal CPV1 and a second gate clock signal CPV2 to the driving voltage modulator 720 and the clock signal generator 726, and outputs the scanning start signal STV to the driving voltage generator 710. Referring to FIG. 8, the scanning start signal STV includes a pulse generated in a frame period. The first gate clock signal CPV1 and the second gate clock signal CPV2 have waveforms opposite to each other, and the time width of the pulse may be about two horizontal periods 2H. A duty ratio of the first and second gate clock signals CPV1 and CPV2 may be about 50%.

The driving voltage generator 710 receives the scanning start signal STV from the signal controller 600, generates the basic gate-on voltage Von, the basic gate-off voltage Voff and the common low voltage Vss based on the scanning start signal and outputs the basic gate-on and gate-off voltages Von and Voff to the driving voltage modulator 720. The common low voltage Vss is a constant direct current ("DC") voltage DC and may be a voltage that turns off the thin film transistor included in the gate driver 400b, and voltage level of the basic gate-off voltages Voff may be substantially the same as the voltage level of the common low voltage Vss.

The driving voltage modulator 720 receives the scanning start signal STV and the first and second gate clock signals CPV1 and CPV2 from the signal controller 600 and receives the basic gate-on voltage Von, the basic gate-off voltage Voff and the common low voltage Vss from the driving voltage generator 710, and generates first and second modulated gate-on voltages Von'1 and Von'2 and first and second modulated gate-off voltages Voff'1 and Voff'2 based on the scanning start signal STV, the first and second gate clock signals CPV1 and CPV2, the basic gate-on voltage Von, the basic gate-off voltage Voff and the common low voltage Vss.

In an exemplary embodiment, the driving voltage modulator 720 may include an overshoot generator 722 and a undershoot generator 724. The overshoot generator 722 adds the overshoot voltage Vos based on the basic gate-on voltages (e.g., a first basic gate-on voltage Von1, a second basic gate-on voltage Von2, . . . an n-th basic gate-on voltage Vonn) corresponding to the gate lines G1 to Gn and generates the modulated first gate-on voltage Von'1 corresponding to the first gate clock signal CPV1 and the modulated second gate-on voltage Von'2 corresponding to the second gate clock signal CPV2. In an exemplary embodiment, the undershoot generator 724 generates the modulated first gate-off voltage Voff'1 corresponding to the first gate clock signal CPV1 and the modulated second gate-off voltage Voff'2 corresponding to the second gate clock signal CPV2 by adding the undershoot voltage Vus based on the basic gate-off voltage Voff.

Referring to FIG. 8, the overshoot generator 722 selects the basic gate-on voltage Von corresponding to the rising edge of the pulse of the first gate clock signal CPV1 generated after the pulse of the scanning start signal STV to maintain the basic gate-on voltage during about two horizontal periods 2H. Two adjacent pulses of the first gate clock signal CPV1 may correspond to two gate lines G1 to Gn, which are neighboring and opposite to each other with respect to a gate line disposed therebetween. In such an embodiment, the basic gate-on voltage corresponding to the pulse of the first gate clock signal CPV1 after the pulse of the scanning start signal STV may be the first basic gate-on voltage Von1, and the basic gate-on voltage corresponding to the pulse of the second first gate clock signal CPV1 may be the third basic gate-on voltage Von3.

In an exemplary embodiment, the overshoot generator 722 adds the overshoot voltage Vos to odd-numbered basic gate-on voltages Von1, Von3, . . . at the rising edge of the pulse of the first gate clock signal CPV for a predetermined time to generate the modulated first gate-on voltage Von'1.

In such an embodiment, the overshoot generator 722 selects the basic gate-on voltage Von corresponding to the rising edge of the pulse of the second gate clock signal CPV2 generated after the falling edge of the pulse of the scanning start signal STV to maintain the basic gate-on voltage during about two horizontal periods 2H. Two adjacent pulses of the second gate clock signal CPV2 may correspond to two gate lines G1 to Gn, which are neighboring and opposite to each other with respect to a gate line disposed therebetween. In such an embodiment, the basic gate-on voltage corresponding to the pulse of the first second gate clock signal CPV1 after the scanning start signal STV may be the second basic gate-on voltage Von2, and the basic gate-on voltage corresponding to the pulse of the second gate clock signal CPV2 may be the fourth basic gate-on voltage Von4.

In an exemplary embodiment, the overshoot generator 722 adds the overshoot voltage Vos to even-numbered basic gate-on voltages Von2, Von4, . . . at the rising edge of the pulse of the second gate clock signal CPV2 for a predetermined time to generate the modulated second gate-on voltage Von'2.

In an alternative exemplary embodiment, the basic gate-on voltage Von may be changed for at least every two gate lines G1 to Gn. In such an embodiment, the first basic gate-on voltage of the modulated first gate-on voltage Von'1 after the pulse of the scanning start signal STV and the first basic gate-on voltage of the modulated second gate-on voltage Von'2 may be substantially identical to the first gate-on voltage Von1. In an exemplary embodiment, where the basic gate-on voltage Von is changed for every two gate lines G1 to Gn, the modulated first gate-on voltage Von'1 and the modulated second gate-on voltage Von'2 may have substantially the same waveform having a phase difference of about one horizontal period 1H.

In an exemplary embodiment, the undershoot generator 724 adds the undershoot voltage Vus to the basic gate-off voltage Voff at the falling edge of the pulse of the first gate clock signal CPV1 generated after the falling edge of the pulse of the scanning start signal STV for a predetermined time to generate the modulated first gate-off voltage Voff'1, and adds the undershoot voltage Vus to the basic gate-off voltage Voff at the falling edge of the pulse of the second gate clock signal CPV2 for a predetermined time to generate the modulated second gate-off voltage Voff'2.

In an exemplary embodiment, where the basic gate-on voltage Von is changed for every two gate lines G1 to Gn, the modulated first gate-off voltage Voff'1 and the modulated second gate-off voltage Voff'2 may have substantially the same waveform having a phase difference of about one horizontal period 1H.

The clock signal generator 726 may receive the modulated first gate-on voltage Von'1, the modulated second gate-on voltage Von'2 and the common low voltage Vss from the driving voltage modulator 720, and may receive the first and second gate clock signals CPV1 and CPV2 from the signal controller 600 to generate the first and second clock signals CLK1 and CLK2.

Referring to FIG. 8, the clock signal generator 726 may select the modulated first gate-on voltage Von'1 corresponding to the high level period of each pulse of the first gate clock signal CPV1 and may select the common low voltage Vss at the time corresponding to the low level period of the first gate clock signal CPV1 to generate the first clock signal CLK1. In such an embodiment, the clock signal generator 726 may select the modulated second gate-on voltage Von'2 corresponding to the high level period of each pulse of the second gate clock signal CPV2 and may select the common low voltage Vss at the time corresponding to the low level period of the second gate clock signal CPV2 to generate the second clock signal CLK2. Each pulse of the first and second clock signals CLK1 and CLK2 may have a period of about two horizontal periods 2H, and the duty ratio thereof may be about 50%, for example, but not being limited thereto. In an exemplary embodiment, the pulse waveforms of the first and second clock signals CLK1 and CLK2 may have a phase difference of one horizontal period 1H.

The gate driver 400b receives the first and second clock signals CLK1 and CLK2 from the clock signal generator 726 and receives the modulated first and second gate-off voltages Voff'1 and Voff'2 from the driving voltage modulator 720 to generate the gate signal Vg including the gate-on pulse GP and apply the gate signal Vg to the gate lines G1 to Gn. In an exemplary embodiment, the first and second clock signals CLK1 and CLK2 inputted from the clock signal generator 726 and the modulated first and second gate-off voltages Voff'1 and Voff'2 inputted from the driving voltage modulator 720 may be inputted to the gate driver 400b through a separate signal wire.

The gate driver 400b may sequentially apply the gate-on pulses GP generated by selecting the voltage of the first clock signal CLK1 corresponding to the pulse of the first gate clock signal CPV1 to odd numbered gate lines G1, G3, . . . , and may sequentially apply the gate-on pulses GP generated by selecting the voltage of the second clock signal CLK2 corresponding to the pulse of the second gate clock signal CPV2 to even numbered gate lines G2, G4, . . . .

Referring again to FIG. 8, the gate-on pulse GP of the gate signal Vg applied to the gate lines G1 to Gn includes modified portion with the overshoot voltage Vos corresponding to the rising edge of the pulse of the first and second gate clock signals CPV1 and CPV2 and a modified portion with the undershoot voltage Vus corresponding to the falling edge of the pulse of the first and second gate clock signals CPV1 and CPV2 based on the basic gate-on voltages Von1, Von2, Von3, . . . , Vonn corresponding to each pulse of the first and second gate clock signals CPV1 and CPV2. The width of each gate-on pulse GP other than the modified portion with the undershoot voltage Vus may be about one horizontal period 1H.

The gate driver 400b may apply the basic gate-off voltage Voff to the gate lines G1 to Gn in the section to which the gate-on pulse GP is not applied.

The data driver 500 is connected to the data lines D1 to Dm of the display panel 300, and applies the data voltage corresponding to the image signal to the data lines D1 to Dm.

In an exemplary embodiment, the gate driver 400b may be integrated on the display panel 300. The gate driver 400b will be described in detail referring to FIG. 6 and FIG. 7.

In an exemplary embodiment, the gate driver 400b may include a shift register including a plurality of stages 410 connected to the gate lines G1 to Gn, respectively, and the scanning start signal STV, the first and second clock signals CLK1 and CLK2 and the modulated first and second gate-off voltages Voff1 and Voff2 are inputted through a separate wire.

Each of the stages 410 includes a set terminal S, a reset terminal R, a gate-off voltage terminal GV, an output terminal OUT and clock terminals, e.g., first and second clock terminals CK1 and CK2.

In an exemplary embodiment, the set terminal S of each of the stages 410, e.g., a j-th stage ST(j), receives a gate signal of a previous stage, e.g., a gate signal of a (j−1)-th stage ST(j−1), that is, a (j−1)-th gate signal Gout(j−1), and the reset terminal R of each of the stages 410, e.g., the j-th stage ST(j), receives a gate signal of a subsequent stage, e.g., a gate signal of a (j+1)-th stage ST(j+1), that is, a (j+1)-th gate signal Gout(j+1), and the first and second clock terminals CK1 and CK2 of each of the stages 410, e.g., the j-th stage ST(j), receive the first and second clock signals CLK1 and CLK2, respectively. The output terminal OUT of the j-th stage ST(j) outputs a j-th gate signal Gout(j) to a corresponding gate line, e.g., a j-th gate line Gj, and the previous and subsequent stages ST(j−1) and ST(j+1). In an alternative exemplary embodiment, a separate output terminal for outputting a carry signal outputted to the previous and subsequent stages ST(j−1) and ST(j+1) may be further provided, and a buffer connected to the output terminal OUT may be further provided.

In an exemplary embodiment, each of the stages 410, e.g., the j-th stage ST(j), is synchronized with the first and second clock signals CLK1 and CLK2 based on a previous gate signal, e.g., the (j−1)-th gate signal Gout(j−1), and a subsequent gate signal, e.g., the (j+1)-th gate signal Gout(j+1), to generate and output the gate signal.

In such an embodiment, the scanning start signal STV is inputted to the first stage ST1 of the gate driver 400b instead of the previous gate signal.

In an alternative exemplary embodiment, where the first clock signal CLK1 and the second clock signal CLK2 are inputted to the clock terminal CK1 and the clock terminal CK2 of the j-th stage ST(j), respectively, the second clock signal CLK2 may be inputted to the first clock terminal CK1 of the (j−1)-th and (j+1)-th stages ST(j−1) and ST(j+1) adjacent thereto and the first clock signal CLK1 may be inputted to the second clock terminal CK2.

Referring to FIG. 7, each of the stages 410, e.g., the j-th stage, of the gate driver 400b may include at least one transistor, e.g., first to seventh transistors T1 to T7 and capacitors, e.g., first and second capacitors C1 and C2, but not being limited thereto. In an exemplary embodiment, the first and second capacitors C1 and C2 may be a parasitic capacitance defined between the gate and the drain/source.

In an exemplary embodiment, the control terminal and the input terminal of the second transistor T2 may be connected to the set terminal S, and the previous gate signal Gout(j−1) may be transmitted to a first contact point J1. In such an embodiment, the control terminal of the third transistor T3 may be connected to the reset terminal R, and the modulated first gate-off voltage Voff1 may be outputted to the first contact point J1. The control terminals of the fourth transistor T4 and the fifth transistor T5 may be connected to a second contact point J2, and the modulated first gate-off voltage Voff1 may be transmitted to the first contact point J1 and the output terminal OUT. The sixth transistor T6 may be connected to the second clock terminal CK2 and the seventh transistor T7 may be connected to the first contact point J1 to transmit the modulated first gate-off voltage Voff1 to the second contact point J2 and the output terminal OUT. In such an embodiment, the control terminal of the first transistor T1 may be connected to the first contact point J1, and the first clock signal CLK1 may be transmitted to the output terminal OUT. The first capacitor C1 is connected between the clock terminal CK1 and the second contact point J2, and the second capacitor C2 is connected between the first contact point J1 and the output terminal OUT.

Now, an operation of the shift register will be described referring to the j-th stage ST(j) shown in FIG. 7.

In an exemplary embodiment, where the j-th stage ST(j) is synchronized with the first clock signal CLK1 to generate the gate signal thereof, the previous and subsequent stages, e.g., the (j−1)-th stage ST(j−1) and the (j+1)-th stage ST(j+1), may be synchronized with the second clock signal CLK2 to generate the gate signals thereof.

In such an embodiment, when the second clock signal CLK2 and the previous gate signal Gout(j−1) are in a high level, the second transistor T2 and the sixth transistor T6 are turned on. Then, the second transistor T2 transmits the gate-on pulse in the high level to the first contact point J1 such that two transistors, e.g., the first transistor T1 and the seventh transistor T7 are turned on. Accordingly, the seventh transistor T7 transmits the modulated first gate-off voltage Voff1 to the second contact point J2, and the sixth transistor T6 transmits the modulated first gate-off voltage Voff1 to the output terminal OUT. In such an embodiment, the first transistor T1 is turned on and outputs the first clock signal CLK1 to the output terminal OUT. In an exemplary embodiment, where the first clock signal CLK1 has the common low voltage Vss, the gate signal Gout(j) maintains the common low voltage Vss. In such an embodiment, the second capacitor C2 charges a voltage corresponding to a difference between the high level voltage of the gate-on pulse GP and the common low voltage Vss.

In an exemplary embodiment, where the subsequent signal Gout(j+1) is in a low level, an input of the reset terminal R is also in a low level. Accordingly, the third, fourth and fifth transistors T3, T4 and T5, the control terminals of which are connected to the reset terminal R and the second contact point J2, are turned off.

In such an embodiment, when the first clock signal CLK1 is in a high level and the second clock signal CLK2 is a low level, the sixth transistor T6 is turned off such that the output terminal OUT blocks the modulated first gate-off voltage Voff'1 and is connected to the first clock signal CLK1 and outputs the high voltage of the gate-on pulse GP as the gate signal Gout(j).

When the subsequent gate signal [Gout(j+1)] is in a high level, the third transistor T3 is turned on and transmits the modulated first gate-off voltage Voff'1 to the first contact point J1. Accordingly, the first transistor T1 is turned off and blocks connection of the first clock signal CLK1 and the output terminal OUT.

In such an embodiment, when the second clock signal CLK2 is in a high level and the turned-on sixth transistor T6 connects the output terminal OUT and the modulated first gate-off voltage Voff'1, the output terminal OUT outputs the modulated first gate-off voltage Voff'1. When the seventh transistor T7 is turned-off and the second contact point J2 is in a floating state, the second contact point J2 maintains the modulated first gate-off voltage Voff'1 having a low voltage, which is a previous voltage.

When the subsequent gate signal [Gout(j+1)] and the second clock signal CLK2 are in a low level, the first and second contact points J1 and J2 maintains the previous voltage in a floating state. In this case, since an end of the first capacitor C1 is connected to the first clock signal CLK1, a potential of the second contact point J2 in a floating state is changed based on the level of the first clock signal CLK1.

Thereafter, the output terminal OUT is connected to the modulated first gate-off voltage Voff'1 through the fifth transistor T5 when the second contact point J2 has a high voltage, that is, when the first clock signal CLK1 is in a high level, and is connected to the modulated first gate-off voltage Voff'1 through the sixth transistor T6 when the second clock signal CLK2 is in a high level.

When the gate signal is generated from the first stage ST1 to the last stage, e.g., an n-th stage ST(n), in such a manner as describe above, and is outputted to the gate lines G1 to Gn, operation during one frame is completed.

Various features, operations of the exemplary embodiment shown in FIGS. 5 to 7 are substantially the same as the operations of the exemplary embodiment shown in FIG. 1 to FIG. 4.

Next, referring to FIG. 9 and FIG. 10, an exemplary embodiment of the driving device according to the invention and the display device including the driving device will be described.

Figure 9:
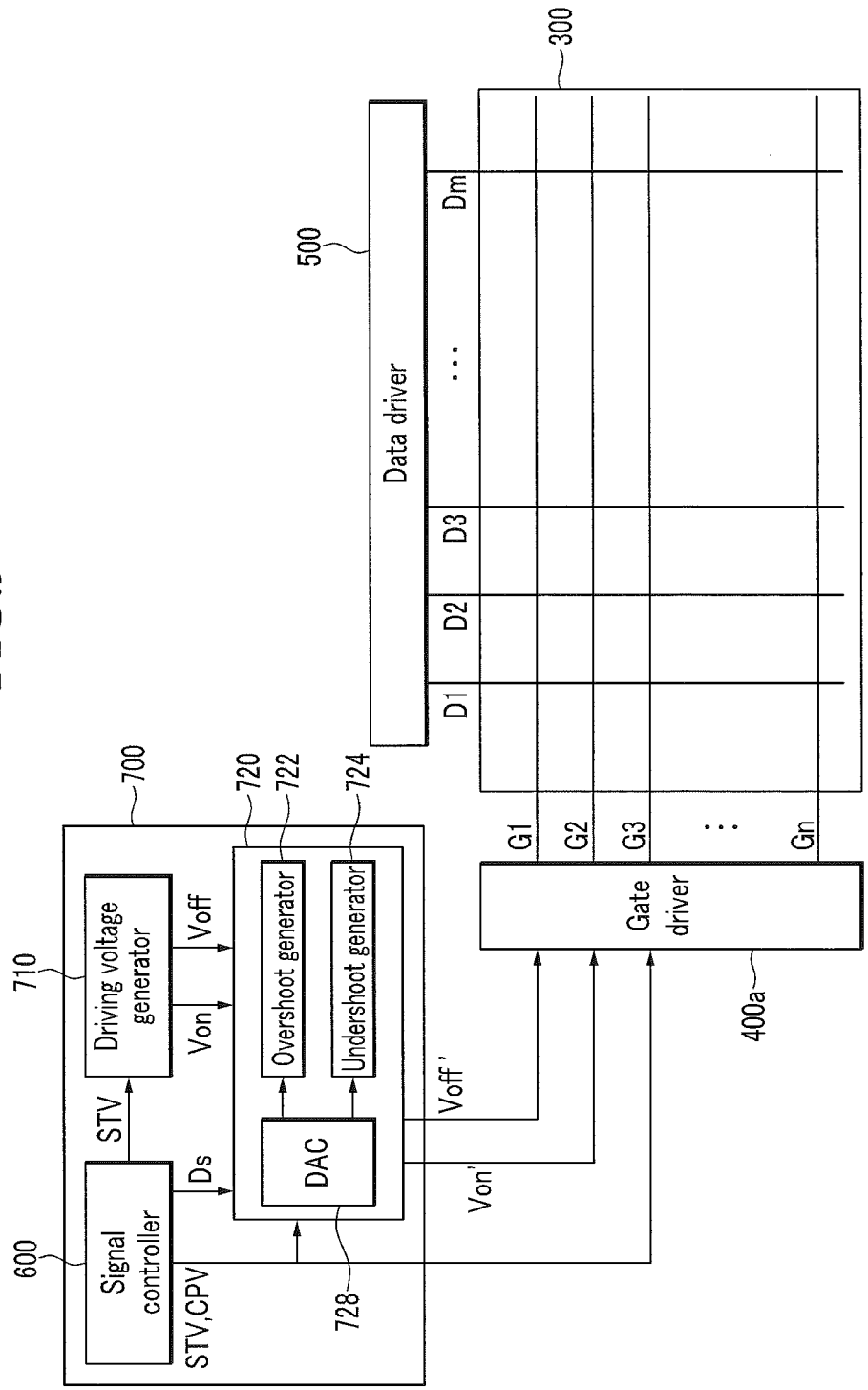
FIG. 9 is a block diagram showing another alternative exemplary embodiment of the display device according to the invention.
Figure 10:
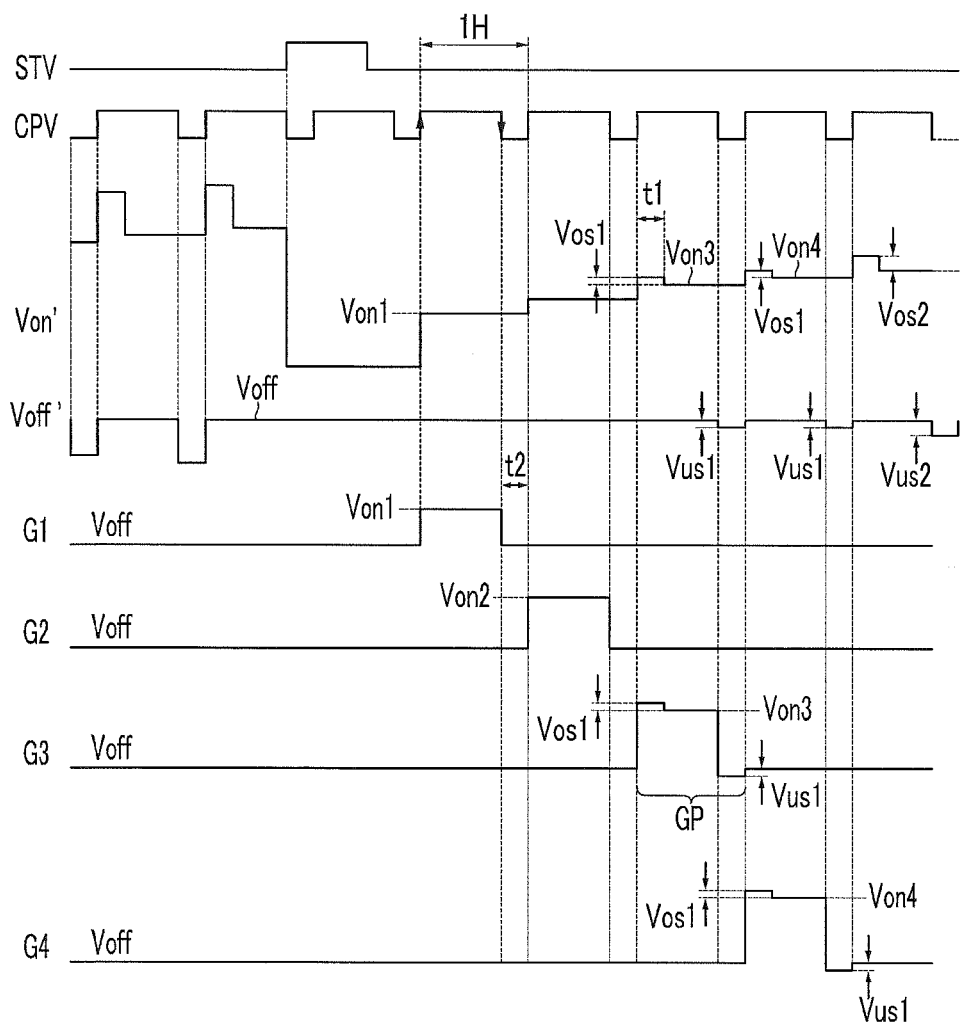
FIG. 10 is a signal timing diagram of the driving signal and the gate signal of an exemplary embodiment of the display device according to the invention.

FIG. 9 is a block diagram showing another alternative exemplary embodiment of the display device according to the invention, and FIG. 10 is a signal timing diagram of the driving signal and the gate signal of an exemplary embodiment of the display device according to the invention.

The display device shown in FIG. 9 is substantially the same as the exemplary embodiments shown in FIG. 1 to FIG. 4 except for the controller 700, and any repetitive detailed description thereof will be omitted.

In an exemplary embodiment, as shown in FIG. 9, the signal controller 600 of the controller 700 may generate a shoot digital signal Ds to transmit the shoot digital signal to the driving voltage modulator 720. In such an embodiment, the controller 700 may further include the driving voltage modulator 720, a digital-analog converter ("DAC") 728 in addition to the overshoot generator 722 and the undershoot generator 724.

In an exemplary embodiment, as shown in FIG. 10, the overshoot voltage Vos may not be constant during one frame. In one exemplary embodiment, for example, the overshoot voltage Vos may be gradually increased from zero (0) during one frame. In such an embodiment, an increase ratio of the overshoot voltage Vos may be substantially constant, but not being limited thereto. In an alternative exemplary embodiment, the overshoot voltage Vos may increase according to various function equations. In an exemplary embodiment, the overshoot voltage Vos corresponding to each pulse of the gate clock signal CPV may increase for every pulse of the gate clock signal CPV, as shown in FIG. 10. In an alternative exemplary embodiment, the overshoot voltage Vos may increase at every two or more pulses of the gate clock signal CPV.

Referring to FIG. 10, the overshoot voltage Vos corresponding to the rising edge of the pulse of the two gate clock signals CPV generated after the pulse of the scanning start signal STV may be zero (0), the overshoot voltage Vos corresponding to the rising edge of the pulse of the two subsequent gate clock signals CPV may be the first overshoot voltage Vos1, the overshoot voltage Vos corresponding to the rising edge of the pulse of the next two subsequent gate clock signals CPV may be the second overshoot voltage Vos2, and the voltage level of the overshoot voltages Vos1, Vos2, ... may gradually increase in such a manner.

In an exemplary embodiment, the undershoot voltage Vus may not be constant during one frame. In one exemplary embodiment, for example, the absolute value of the undershoot voltage Vus may gradually increase from zero (0) during one frame. In such an embodiment, an increase ratio of the absolute value of the undershoot voltage Vus may be substantially constant, but not being limited thereto. In an alternative exemplary embodiment, the absolute value of the undershoot voltage Vus may increase according to various function equations. In an exemplary embodiment, the absolute value of the undershoot voltage Vus may increase at every pulse of the gate clock signal CPV. In an alternative exemplary embodiment, the absolute value of the undershoot voltage Vus may be changed at every two or more pulses of the gate clock signal CPV. In one exemplary embodiment, as shown in FIG. 10, the undershoot voltage Vus is changed at every two pulses of the gate clock signal CPV.

Referring to FIG. 10, the undershoot voltage Vus corresponding to the falling edge of the pulse of the two gate clock signals CPV generated after the pulse of the scanning start signal STV may be zero (0), the undershoot voltage Vus corresponding to the falling edge of the pulse of two subsequent gate clock signals CPV may be the first undershoot voltage Vus1, the undershoot voltage Vus corresponding to the falling edge of the pulse of the next two subsequent gate clock signals CPV may be the second undershoot voltage Vus2, and the absolute value of the undershoot voltages Vus1, Vus2, ... may gradually increase in such a manner.

The shoot digital signal Ds includes information on at least one of the overshoot voltage Vos and the undershoot voltage Vus changed over a one-frame period, as described above. The number of bits of the shoot digital signal Ds may depend on resolution of an image or the number of gate lines G1 to Gn included in a display panel 300.

The digital-analog converter 728 converts the shoot digital signal Ds into the shoot analog voltage and transmits the shoot analog voltage to the overshoot generator 722 and the undershoot generator 724. Then, the overshoot generator 722 and the undershoot generator 724 may generate the modulated gate-on voltage Von' and the modulated gate-off voltage Voff,' as shown in FIG. 10, using the shoot analog voltage.

In an exemplary embodiment, the absolute value of the overshoot voltage Vos and the absolute value of the undershoot voltage Vus included in the gate-on pulse GP of the gate signal Vg may sequentially increase in the order of gate lines G1 to Gn. In one exemplary embodiment, for example, the overshoot voltage Vos and the undershoot voltage Vus of the gate-on pulse GP outputted to the first and second gate lines G1 and G2 may be zero (0), and the gate-on pulse GP outputted to the third and fourth gate lines G3 and G4 may include the first overshoot voltage Vos1 and the first undershoot voltage Vus1.

In such an embodiment, the gate-on pulse GP outputted to the fifth and sixth gate lines G5 and G6 may include the second overshoot voltage Vos2 and the second undershoot voltage Vus2. The overshoot voltage Vos and the undershoot voltage Vus may be reset into an initial value at the beginning of a pulse of the scanning start signal STV.

In an exemplary embodiment, the gate-on pulse GP applied to a front end of a gate line, where substantially small signal delay occurs, may include relatively small overshoot and undershoot voltages, and the absolute values of the overshoot voltage Vos and the undershoot voltage Vus of the gate-on pulse GP increase as going to the rear end of the gate line, where substantially large signal delay occurs. In such an embodiment, distortion of the gate signal waveform by the signal delay along the display panel 300 may be substantially reduced and the luminance deviation according to the position of the display panel 300 may be substantially reduced.

Next, referring to FIG. 11 and FIG. 12, another alternative exemplary embodiment of the driving device according to the invention and the display device including the driving device will be described.

Figure 11:
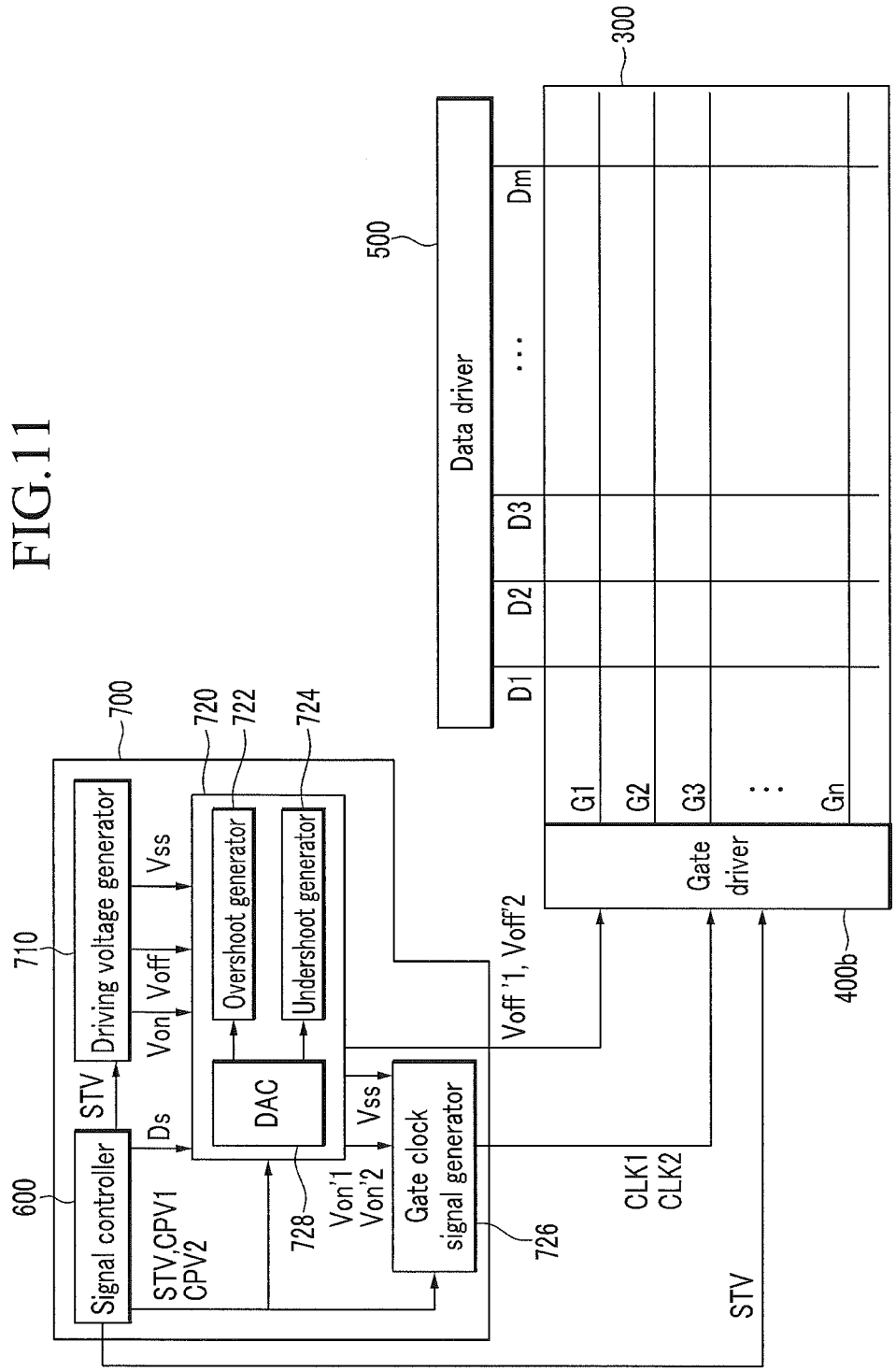
FIG. 11 is a block diagram another alternative exemplary embodiment of the display device according to the invention.
Figure 12:
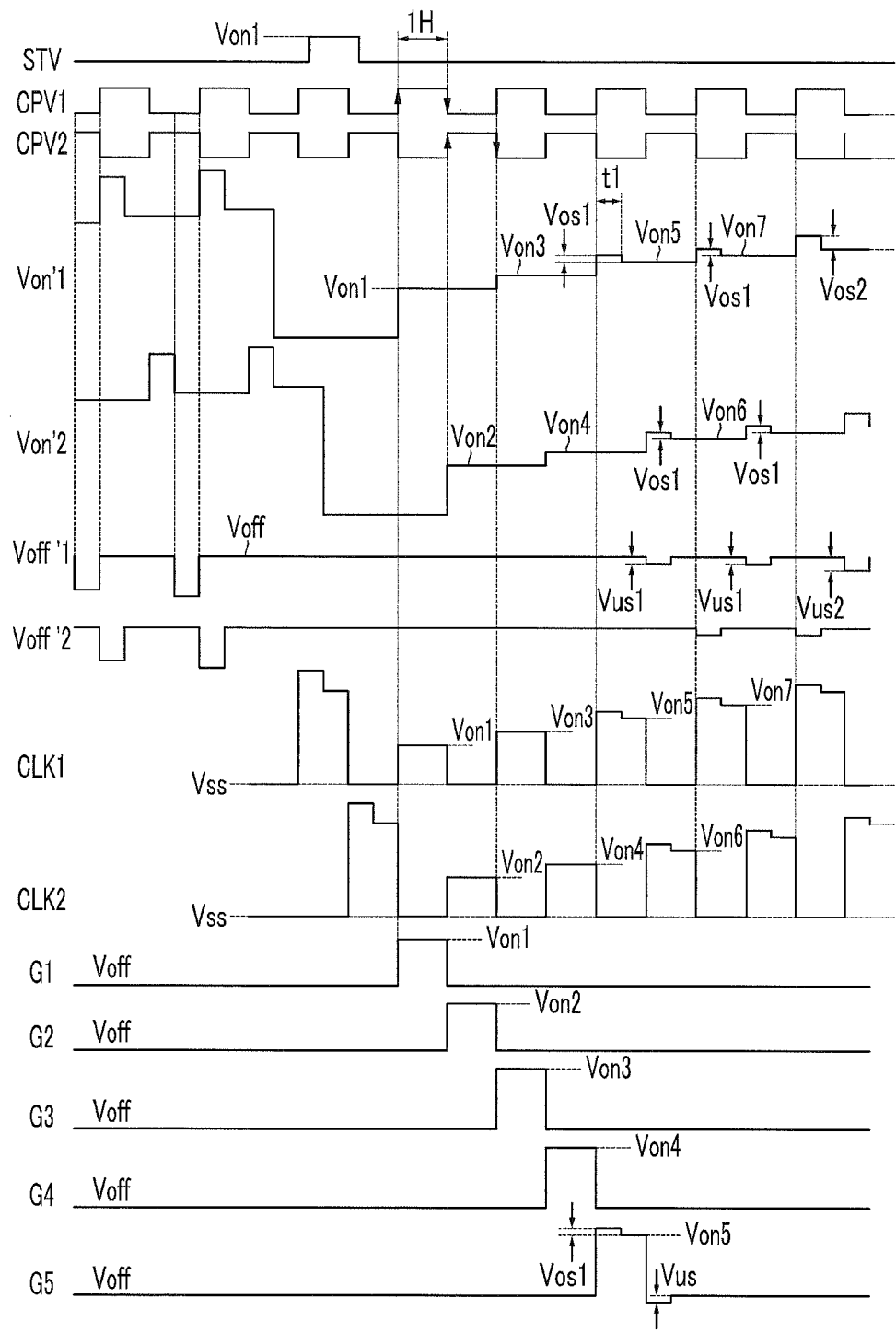
FIG. 12 is a signal timing diagram of the driving signal and the gate signal of an exemplary embodiment of the display device according to the invention.

FIG. 11 is a block diagram showing an exemplary embodiment of the display device according to the invention, and FIG. 12 is a signal timing diagram of the driving signal and the gate signal of an exemplary embodiment of the display device according to the invention.

The display device shown in FIGS. 11 and 12 is substantially the same as the exemplary embodiments shown in FIG. 5 to FIG. 8 except for the driving voltage modulator 720, and any repetitive detailed description thereof will be hereinafter omitted or simplified.

In an exemplary embodiment, as shown in FIG. 11, the signal controller 600 may further generate a shoot digital signal Ds and transmits the shoot digital signal to the driving voltage modulator 720. In such an embodiment, the driving voltage modulator 720 may further include a digital-analog converter 728 in addition to the overshoot generator 722 and the undershoot generator 724.

In an exemplary embodiment, as shown in FIG. 11, the overshoot voltage Vos and the undershoot voltage Vus may not be substantially constant during one frame as in the exemplary embodiments shown in FIG. 9 and FIG. 10, and the detailed description thereof will be omitted.

In an exemplary embodiment, as shown in FIG. 12, the overshoot voltage Vos is changed at every two pulses of the first gate clock signal CPV1 or the second gate clock signal CPV2. The overshoot voltage Vos corresponding to the rising edge of two pulses of the first gate clock signal CPV1 and two pulses of the second gate clock signal CPV2 generated after the pulse of the scanning start signal STV may be zero (0), the overshoot voltage Vos corresponding to the rising edge of two subsequent pulses of the first gate clock signal CPV1 or the second gate clock signal CPV2 may be the first overshoot voltage Vos1, the overshoot voltage Vos corresponding to the rising edge of the next two subsequent pulses may be the second overshoot voltage Vos2, and the overshoot voltages Vos1, Vos2, . . . may gradually increase in such a manner.

In such an embodiment, the undershoot voltage Vus may be changed at every two pulses of the first gate clock signal CPV1 or the second gate clock signal CPV2. The undershoot voltage Vus corresponding to the falling edge of two pulses of the first gate clock signal CPV1 and two pulses of the second gate clock signal CPV2 generated after the pulse of the scanning start signal STV may be zero (0), the undershoot voltage Vus corresponding to the falling edge of the two subsequent pulses of the first gate clock signal CPV1 or the second gate clock signal CPV2 may be the first undershoot voltage Vus1, the undershoot voltage Vus corresponding to the falling edge of the next two subsequent pulses may be the second undershoot voltage Vus2, and the absolute value of the undershoot voltages Vus1, Vus2, . . . may gradually increase in such a manner.

The shoot digital signal Ds includes information on the overshoot voltage Vos and the undershoot voltage Vus changed during one frame, as described above.

The digital-analog converter 728 converts the shoot digital signal Ds into the shoot analog voltage and transmits the shoot analog voltage to the overshoot generator 722 and the undershoot generator 724. Then, the overshoot generator 722 and the undershoot generator 724 may generate the modulated first and second gate-on voltages Von'1 and Von'2 and the modulated first and second gate-off voltages Voff'1 and Voff'2, as shown in FIG. 12, using the shoot analog voltage.

In an exemplary embodiment, the gate-on pulse GP of the gate signal Vg applied to the first to fourth gate lines G1 to G4 does not include the overshoot voltage Vos or the undershoot voltage Vus, and the gate-on pulse GP of the gate signal Vg applied to the fifth gate line G5 may include the overshoot voltage Vos and the undershoot voltage Vus. In an exemplary embodiment, as shown in FIG. 12, the absolute value of the overshoot voltage Vos or the undershoot voltage Vus may increase at every four gate lines, but not being limited thereto. In an alternative exemplary embodiment, the absolute value of the overshoot voltage Vos or the undershoot voltage Vus may increase at every one or more gate lines.

Next, referring to FIG. 13, another exemplary embodiment of the display device according to the invention will be described.

Figure 13:
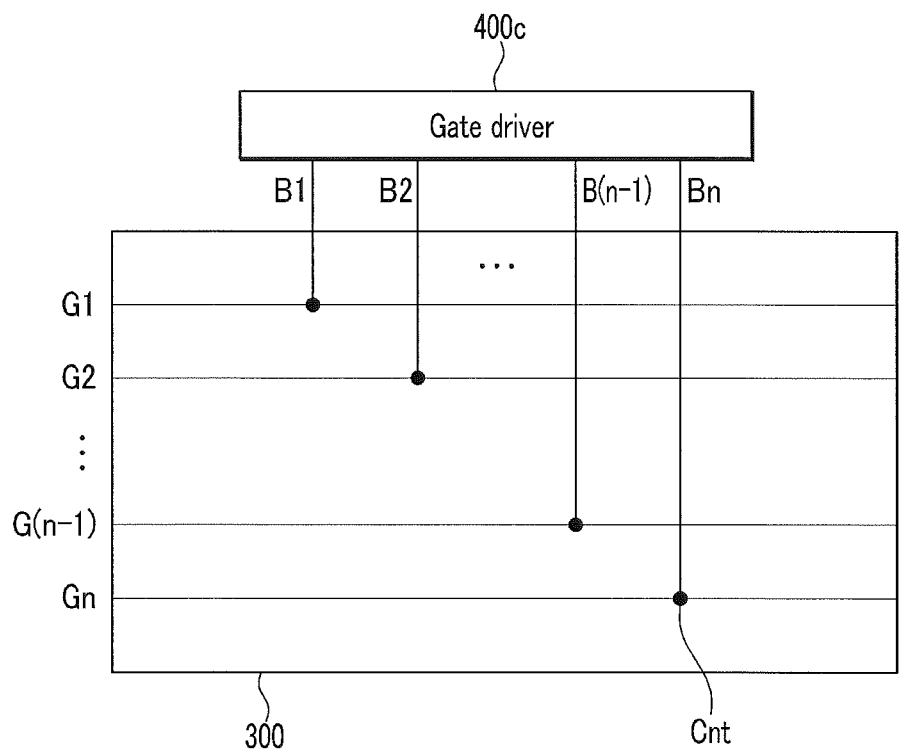
FIG. 13 is a block diagram an exemplary embodiment of the display device according the invention.

FIG. 13 is a block diagram showing an exemplary embodiment of the display device according the invention.

Referring to FIG. 13, an exemplary embodiment of the display device includes the display panel 300 and the driving device that drives the display panel 300, and the driving device may include the gate driver 400c and other constituent elements described above.

In such an embodiment, the gate driver 400c may be connected to the gate lines G1 to Gn through a plurality of connection lines, e.g. a first connection line B1, a second connection line B2, . . . , an (n−1)-th connection line B n−1, and an n-th connection line Bn. The connection lines B1, B2, . . . , B n−1 and Bn and the gate lines G1 to Gn may be electrically connected to each other through a contact point Cnt.

In an exemplary embodiment, the gate lines G1 to Gn extend substantially in a horizontal direction, and the connection lines B1, B2, . . . , B n−1, and Bn may cross the gate lines G1 to Gn and extend substantially in a vertical direction. In such an embodiment, the gate driver 400c may be disposed at a position that is closer to the first gate line G1 than the last gate line, e.g., the n-th gate line Gn. Accordingly, the lengths of the connection lines B1, B2, . . . , B n−1, and Bn gradually increase as going from the first connection line B1 connected to the first gate line G1 or the first gate line G1 to the n-th connection line Bn connected to the last gate line, e.g., the n-th gate line Gn. Accordingly, in such an embodiment, the signal delay of the gate signal Vg generated in the gate driver 400c may increase due to wire resistance, parasitic capacitance or the like as going to the lower portion on which the last gate line Gn is disposed.

In an exemplary embodiment, the gate-on pulse GP includes the overshoot voltage Vos and the undershoot voltage Vus, and the basic gate-on voltage Von increases as going to the lower portion of the display panel 300, distortion and deviation of the gate-on pulse GP of the gate signal Vg by the signal delay is substantially reduced, and an image having substantially uniform luminance is thereby displayed regardless of the position of the display panel 300.

In an exemplary embodiment, when distortion occurs in data voltage or deviation occurs in timing applied to the switching element of the pixel due to resistance, parasitic capacitance and the like of the data line (not shown) extending from the upper portion to the lower portion of the display panel 300, application timing of the gate signal Vg and application timing of the data voltage may be substantially synchronized with each other and the signal delay of the data voltage may be compensated by modulating the gate-on pulse GP of the gate signal Vg to apply the modulated pulse to the gate line G1 to Gn.

In exemplary embodiments of the invention as described herein, the gate-on pulse GP includes both the overshoot voltage Vos and the undershoot voltage Vus based on the basic gate-on voltage Von and the basic gate-off voltage Voff, but the invention is not limited thereto. In an alternative exemplary embodiment, only one of the overshoot voltage Vos and the undershoot voltage Vus may be added to the basic gate-on voltage Von or the basic gate-off voltage Voff.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
  a display panel comprising a plurality of gate lines and a plurality of pixels disposed thereon;
  a gate driver which applies a gate signal to the gate lines; and
  a controller which controls the gate driver;
  wherein the controller comprises:
    a signal controller which generates a scanning start signal and a gate clock signal comprising a plurality of pulses, wherein the scanning start signal instructs to start a scanning of the gate signal; and
    a driving voltage modulator which generates a modulated gate-on voltage and a modulated gate-off voltage based on a basic gate-on voltage and a basic gate-off voltage, respectively,
    wherein the driving voltage modulator adds an overshoot voltage corresponding to a rising edge of a pulse of the gate clock signal to the basic gate-on voltage and adds an undershoot voltage corresponding to a falling edge of the pulse of the gate clock signal to the basic gate-off voltage.

2. The display device of claim 1, wherein
the gate signal comprises a gate-on pulse,
the gate-on pulse comprises the modulated gate-on voltage corresponding to a high level section of the pulse of the gate clock signal and the modulated gate-off voltage corresponding to a low level section of the gate clock signal.

3. The display device of claim 2, wherein a voltage level of the basic gate-on voltage increases on a frame-period-by-frame-period basis such that the basic gate-on voltage corresponding to the gate lines is changed for every at least one gate line.

4. The display device of claim 3, wherein the basic gate-off voltage is substantially constant.

5. The display device of claim 4, wherein
the signal controller generates a shoot digital signal including information on at least one of the overshoot voltage changed over a one-frame period and the undershoot voltage changed over a one-frame period and transmits the information to the driving voltage modulator,
the driving voltage modulator includes a digital-analog converter which converts the shoot digital signal into a shoot analog voltage,
the driving voltage modulator generates the modulated gate-on voltage and the modulated gate-off voltage based on the shoot analog voltage.

6. The display device of claim 5, wherein
at least one of the overshoot voltage and the undershoot voltage is changed at every at least one pulse of the gate clock signal.

7. The display device of claim 6, wherein
the gate driver receives the modulated gate-on voltage, the modulated gate-off voltage and the gate clock signal and generates the gate signal to be sequentially inputted to the plurality of gate lines.

8. The display device of claim 6, wherein
the controller further comprises a clock signal generator, wherein the clock signal generator receives the modulated gate-on voltage and a common low voltage, generates a clock signal based on the scanning start signal and the gate clock signal and transmits the clock signal to the gate driver.

9. The display device of claim 8, wherein
the gate clock signal comprises a first gate clock signal and a second gate clock signal, which are reversed from each other,
the modulated gate-on voltage comprises a modulated first gate-on voltage corresponding to the first gate clock signal and a modulated second gate-on voltage corresponding to the second gate clock signal,
the modulated gate-off voltage comprises a modulated first gate-off voltage corresponding to the first gate clock signal and a modulated second gate-off voltage corresponding to the second gate clock signal, and
the clock signal comprises a first clock signal generated based on the modulated first gate-on voltage and the first gate clock signal and a second clock signal generated based on the modulated second gate-on voltage and the second gate clock signal.

10. The display device of claim 9, wherein
the gate driver comprises a plurality of stages, wherein the gate driver generates the gate signal based on the scanning start signal, the first and second clock signals and the modulated first and second gate-off voltages, and outputs the gate signal to the gate lines.

11. The display device of claim 1, wherein
a voltage level of the basic gate-on voltage increases on a frame-period-by-frame-period basis such that the basic gate-on voltage corresponding to the plurality of gate lines is changed for every at least one gate line.

12. The display device of claim 1, wherein
the signal controller generates a shoot digital signal including information on at least one of the overshoot voltage changed over a one-frame period and the undershoot voltage changed over a one-frame period and inputs the information to the driving voltage modulator, the driving voltage modulator comprises a digital-analog converter which converts the shoot digital signal into a shoot analog voltage, the driving voltage modulator generates the modulated gate-on voltage and the modulated gate-off voltage based on the shoot analog voltage.

13. The display device of claim 12, wherein
at least one of the overshoot voltage and the undershoot voltage is changed at every at least one pulse of the gate clock signal.

14. The display device of claim 1, wherein
the gate driver receives the modulated gate-on voltage, the modulated gate-off voltage and the gate clock signal and generates the gate signal to be sequentially inputted to the gate lines.

15. The display device of claim 1, wherein
the controller further comprises a clock signal generator, wherein the clock signal generator receives the modulated gate-on voltage and a common low voltage, generates a clock signal based on the scanning start signal and the gate clock signal and transmits the clock signal to the gate driver.

16. The display device of claim 15, wherein
the gate clock signal comprises a first gate clock signal and a second gate clock signal, which are reversed from each other, the modulated gate-on voltage comprises a modulated first gate-on voltage corresponding to the first gate clock signal and a modulated second gate-on voltage corresponding to the second gate clock signal, the modulated gate-off voltage comprises a modulated first gate-off voltage corresponding to the first gate clock signal and a modulated second gate-off voltage corresponding to the second gate clock signal, and the clock signal comprises a first clock signal generated based on the modulated first gate-on voltage and the first gate clock signal and a second clock signal generated based on the modulated second gate-on voltage and the second gate clock signal.

17. The display device of claim 16, wherein
the gate driver comprises a plurality of stages, generates the gate signal based on the scanning start signal, the first and second clock signals and the modulated first and second gate-off voltages, and outputs the gate signal to the gate lines.

18. A driving method of a display device, the method comprising:
generating a scanning start signal which instructs to start a scanning of a gate signal and a gate clock signal including a plurality of pulses in a signal controller of a controller of the display device;
generating a basic gate-on voltage and a basic gate-off voltage based on the scanning start signal in a voltage generator of the controller, and
generating a modulated gate-on voltage and a modulated gate-off voltage based on the basic gate-on voltage and the basic gate-off voltage, respectively, in a driving voltage modulator of the controller by adding an overshoot voltage corresponding to a rising edge of a pulse of the gate clock signal to the basic gate-on voltage and adding an undershoot voltage corresponding to a falling edge of the pulse of the gate clock signal to the basic gate-off voltage, wherein the display device comprises:
a display panel comprising a plurality of gate lines and a plurality of pixels disposed thereon;
a gate driver which applies a gate signal to the gate lines; and
the controller which controls the gate driver.

19. The driving method of a display device of claim 18, wherein
the gate signal comprises a gate-on pulse, and
the gate-on pulse comprises the modulated gate-on voltage corresponding to a high level section of the pulse of the gate clock signal and the modulated gate-off voltage corresponding to a low level section of the gate clock signal.

20. The driving method of a display device of claim 19, wherein
a voltage level of the basic gate-on voltage increases based on a frame-period-by-frame-period basis such that the basic gate-on voltage corresponding to the gate lines is changed for every at least one gate line.

21. The driving method of a display device of claim 20, further comprising:
generating a shoot digital signal including information on at least one of the overshoot voltage changed over a one-frame period and the undershoot voltage changed over a one-frame period and inputting the information to the driving voltage modulator in the controller,
converting the shoot digital signal into a shoot analog voltage in the driving voltage modulator, and
generating the modulated gate-on voltage and the modulated gate-off voltage based on the shoot analog voltage in the driving voltage modulator.

22. The driving method of a display device of claim 21, wherein
at least one of the overshoot voltage and the undershoot voltage is changed for every at least one pulse of the gate clock signal.

23. The driving method of a display device of claim 22, further comprising:
transmitting the modulated gate-on voltage, the modulated gate-off voltage and the gate clock signal to the gate driver which generates the gate signal to be sequentially inputted to the gate lines.

24. The driving method of a display device of claim 22, further comprising:
transmitting the modulated gate-on voltage and a common low voltage to a clock signal generator of the controller, wherein the clock signal generator generates a clock signal based on the scanning start signal and the gate clock signal, and transmits the clock signal to the gate driver.

25. The driving method of a display device of claim 24, wherein
the gate clock signal comprises a first gate clock signal and a second gate clock signal that have a reverse form to each other,
the modulated gate-on voltage comprises a modulated first gate-on voltage corresponding to the first gate clock signal and a modulated second gate-on voltage corresponding to the second gate clock signal,
the modulated gate-off voltage comprises a modulated first gate-off voltage corresponding to the first gate clock signal and a modulated second gate-off voltage corresponding to the second gate clock signal, and
the clock signal comprises a first clock signal generated based on the modulated first gate-on voltage and the first gate clock signal and a second clock signal generated based on the modulated second gate-on voltage and the second gate clock signal.

26. The driving method of a display device of claim 25, wherein
the gate driver comprises a plurality of stages, generates the gate signal based on the scanning start signal, the first and second clock signals and the modulated first and second gate-off voltages, and outputs the gate signal to the gate lines.

* * * * *